(12) United States Patent
Amano

(10) Patent No.: US 8,039,369 B2
(45) Date of Patent: Oct. 18, 2011

(54) SEMICONDUCTOR LIGHT-EMITTING ELEMENT AND METHOD OF PRODUCING THE SAME

(75) Inventor: Takeru Amano, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 345 days.

(21) Appl. No.: 12/199,466

(22) Filed: Aug. 27, 2008

(65) Prior Publication Data

US 2008/0318355 A1 Dec. 25, 2008

Related U.S. Application Data

(62) Division of application No. 11/210,735, filed on Aug. 25, 2005, now abandoned.

(30) Foreign Application Priority Data

Aug. 26, 2004 (JP) ................................. 2004-246024
Jul. 21, 2005 (JP) ................................. 2005-211675

(51) Int. Cl.
H01L 21/00 (2006.01)
H01L 21/36 (2006.01)

(52) U.S. Cl. .......... 438/478; 438/956; 438/962; 257/13; 257/82; 257/E21.097; 257/E21.131; 257/E31.022; 257/E31.033

(58) Field of Classification Search ........... 438/22, 438/24, 28, 44, 46, 47, 956; 257/81–97, 257/E21.071, E21.097, E21.098, E21.108, 257/E21.119, E21.126, E21.131, E21.408, 257/E31.022, E31.033
See application file for complete search history.

(56) References Cited

U.S. PATENT DOCUMENTS

| | | | |
|---|---|---|---|
| 5,756,375 A * | 5/1998 | Celii et al. ...................... 438/94 |
| 5,953,356 A * | 9/1999 | Botez et al. ................ 372/45.01 |
| 6,600,169 B2 * | 7/2003 | Stintz et al. ...................... 257/14 |
| 6,782,021 B2 * | 8/2004 | Huang et al. ............. 372/45.013 |
| 6,885,023 B2 * | 4/2005 | Shields et al. .................. 257/21 |
| 7,101,444 B2 * | 9/2006 | Shchukin et al. ............... 148/33 |
| 7,119,358 B2 * | 10/2006 | Werner et al. .................... 257/15 |
| 7,425,296 B2 * | 9/2008 | Cochran et al. ................ 264/458 |
| 2002/0081825 A1 * | 6/2002 | Williams et al. .............. 438/493 |
| 2002/0114367 A1 * | 8/2002 | Stintz et al. ...................... 372/45 |
| 2002/0176474 A1 * | 11/2002 | Huang et al. .................... 372/96 |
| 2003/0073258 A1 | 4/2003 | Mukai et al. |
| 2004/0021138 A1 * | 2/2004 | Shields et al. .................. 257/17 |
| 2004/0169173 A1 | 9/2004 | Saito |
| 2004/0183062 A1 * | 9/2004 | Tang et al. ...................... 257/14 |
| 2005/0155641 A1 * | 7/2005 | Fafard .......................... 136/249 |
| 2005/0211996 A1 | 9/2005 | Krishna et al. |
| 2005/0279989 A1 | 12/2005 | Li et al. |
| 2006/0076552 A1 | 4/2006 | Ebe et al. |

* cited by examiner

*Primary Examiner* — Thao Le
*Assistant Examiner* — Eric Jones
(74) *Attorney, Agent, or Firm* — Oblon, Spivak, McClelland, Maier & Neustadt, L.L.P.

(57) ABSTRACT

There is provided a semiconductor light-emitting element and a method of producing the same including high density and high quality quantum dots emitting light at a wavelength of 1.3 μm. A semiconductor light-emitting element has a first GaAs layer, a second InAs thin film layer having the plurality of InAs quantum dots formed on the first GaAs layer, a third InGaAs layer formed on the second InAs thin film layer having the plurality of InAs quantum dots, and a fourth GaAs layer formed on the third InGaAs layer, wherein the As source is $As_2$.

3 Claims, 16 Drawing Sheets

FIG. 12

| WAVELENGTH [nm] | LIGHT-EMITTING INTENSITY | WAVELENGTH [nm] | LIGHT-EMITTING INTENSITY | WAVELENGTH [nm] | LIGHT-EMITTING INTENSITY |
|---|---|---|---|---|---|
| 1120 | 15.6 | 1200 | 30.6 | 1160 | 2 |
| 1125 | 17.8 | 1205 | 30.2 | 1165 | 7.6 |
| 1130 | 23.8 | 1210 | 32.8 | 1170 | 9.8 |
| 1135 | 21 | 1215 | 31.2 | 1175 | -4.4 |
| 1140 | 29 | 1220 | 34.8 | 1180 | 13.4 |
| 1145 | 34.2 | 1225 | 37.6 | 1185 | 12.2 |
| 1150 | 37.4 | 1230 | 39.2 | 1190 | 11.6 |
| 1155 | 37 | 1235 | 40.8 | 1195 | 24.6 |
| 1160 | 46.8 | 1240 | 32 | 1200 | 19 |
| 1165 | 55 | 1245 | 51.8 | 1205 | 28.2 |
| 1170 | 78.6 | 1250 | 57.8 | 1210 | 32.2 |
| 1175 | 93 | 1255 | 67.2 | 1215 | 31.6 |
| 1180 | 85.6 | 1260 | 73.4 | 1220 | 39.4 |
| 1185 | 97 | 1265 | 87.6 | 1225 | 39 |
| 1190 | 106 | 1270 | 107 | 1230 | 52.6 |
| 1195 | 89.6 | 1275 | 123.6 | 1235 | 54.8 |
| 1200 | 108.6 | 1280 | 166 | 1240 | 63.6 |
| 1205 | 102 | 1285 | 236.8 | 1245 | 65.2 |
| 1210 | 85.6 | 1290 | 343.2 | 1250 | 69.8 |
| 1215 | 73 | 1295 | 468.8 | 1255 | 79.4 |
| 1220 | 62 | 1300 | 585.6 | 1260 | 91 |
| 1225 | 29 | 1305 | 648.6 | 1265 | 103.4 |
| 1230 | 20.4 | 1310 | 617.4 | 1270 | 110.8 |
| 1235 | 10.8 | 1315 | 489.8 | 1275 | 125 |
| 1240 | 8.8 | 1320 | 350.2 | 1280 | 121 |
| 1245 | 6.4 | 1325 | 214.2 | 1285 | 127.2 |
| 1250 | 4.6 | 1330 | 119.8 | 1290 | 134.8 |
| 1255 | -17.2 | 1335 | 63.8 | 1295 | 147.6 |
| 1260 | 6 | 1340 | 33.8 | 1300 | 161.6 |
| | | 1345 | 29.2 | 1305 | 174.8 |
| | | 1350 | 10.4 | 1310 | 202.6 |
| | | 1355 | -4.8 | 1315 | 240.8 |
| | | 1360 | 4.6 | 1320 | 277 |
| | | | | 1325 | 289.2 |
| | | | | 1330 | 261.4 |
| | | | | 1335 | 209 |
| | | | | 1340 | 145.4 |
| | | | | 1345 | 73.6 |
| | | | | 1350 | 36.8 |
| | | | | 1355 | 2 |
| | | | | 1360 | 11.6 |
| | | | | 1365 | 5.6 |

FIG. 14

| WAVELENGTH [nm] | LIGHT-EMITTING INTENSITY |
|---|---|
| 1250 | 18.33333 |
| 1255 | 22 |
| 1260 | 26 |
| 1265 | 27.66667 |
| 1270 | 34.33333 |
| 1275 | 40.33333 |
| 1280 | 52.66667 |
| 1285 | 67 |
| 1290 | 103 |
| 1295 | 142.6667 |
| 1300 | 196.3333 |
| 1305 | 243.6667 |
| 1310 | 268.6667 |
| 1315 | 247.3333 |
| 1320 | 214.3333 |
| 1325 | 155 |
| 1330 | 95.66667 |
| 1335 | 51.66667 |
| 1340 | 24.33333 |
| 1345 | 17.33333 |
| 1350 | 9 |

SEMICONDUCTOR LIGHT-EMITTING ELEMENT AND METHOD OF PRODUCING THE SAME

BACKGROUND OF THE INVENTION

The present invention relates to a semiconductor light-emitting element and a method of producing the same. More particularly, the present invention relates to a semiconductor laser and a method of producing the same that can be used at the 1.3 μm wavelength region for optical communication.

In the semiconductor light-emitting element using InAs quantum dots, high density is essential in order to improve the quality. The quantum dots have a trade-off relationship between the high density and a long wavelength.

Conventionally, high density cannot be realized at the 1.3 μm wavelength region for communication. Quantum dots that emit light at a wavelength of 1.3 μm or more have a density of about $2 \times 10^{10}$ cm$^{-2}$. Quantum dots that emit light at the 1.27 μm wavelength region have a density of $8.7 \times 10^{10}$ cm$^{-2}$. See Japanese Unexamined Patent Application Publication No. 2001-24284. A GaInAs layer formed on an InAs layer cannot contain an increased content of In because of the occurrence of a transition or the like.

In view of the above, an object of the present invention is to provide a semiconductor light-emitting element and a method of producing the same including high density and high quality quantum dots emitting light at a wavelength of 1.3 μm.

SUMMARY OF THE INVENTION

In order to achieve the object, the present invention utilizes the following solving means:

(1) An arsenic source is changed from As$_4$ to As$_2$.
(2) A growth temperature and a growth speed are optimized.
(3) An InGaAs layer having a high In content is used.
(4) An InGaAs layer with a modified composition is used.

Preferably, a planar semiconductor light-emitting element is used to adjust the area for handling light, and to increase the number of quantum dots.

A first aspect of the present invention is a semiconductor light-emitting element, having:
 a first GaAs layer,
 a second InAs thin film layer having the plurality of InAs quantum dots formed on the first GaAs layer,
 a third InGaAs layer formed on the second InAs thin film layer having the plurality of InAs quantum dots, and
 a fourth GaAs layer formed on the third InGaAs layer,
 wherein the As source is As$_2$.

According to the first aspect of the present invention, the second InAs thin film layer having the plurality of InAs quantum dots formed on the first GaAs layer is formed at a growth temperature of not less than 540° C. and at a growth speed of not less than 0.006 mL/s.

According to the first aspect of the present invention, the semiconductor light-emitting element has a light emission wavelength within a range of 1.28 to 1.34 mm, a surface density of not less than $6 \times 10^{10}$ cm$^{-2}$ and a half width of not more than 40 meV.

A second aspect of the present invention is a method of producing a semiconductor light-emitting element, having the steps of:
 forming a GaAs layer on a semiconductor substrate,
 forming an InAs thin film layer having the plurality of InAs quantum dots on the GaAs layer,
 forming an InGaAs layer on the InAs thin film layer having the plurality of InAs quantum dots, and
 forming another GaAs layer on the InGaAs layer,
 wherein As source is As$_2$.

According to the second aspect of the present invention, the InAs thin film layer having the plurality of InAs quantum dots is produced at a growth temperature of not less than 540° C.

According to the second aspect of the present invention, the InAs thin film layer having the plurality of InAs quantum dots is produced at a growth temperature of not less than 540° C. but not more than the evaporating temperature of indium.

According to the second aspect of the present invention, the InAs thin film layer having the plurality of InAs quantum dots is produced at a growth speed of not less than 0.006 mL/s.

According to the second aspect of the present invention, the InAs thin film layer having the plurality of InAs quantum dots is produced at a growth temperature of not less than 540° C. and at a growth speed of not less than 0.006 mL/s.

A third aspect of the present invention is a laminated semiconductor light-emitting element, having the plurality of the semiconductor light-emitting elements of the first aspect stacked vertically, wherein the first layer is laminated on the fourth layer.

According to the third aspect of the present invention, an InGaAs layer having a high In content is formed at an interface between the InAs quantum dots and the InGaAs layer, and wherein the amount of In contained in the InGaAs layer is gradually decreased in the direction away from the interface.

A fourth aspect of the present invention is a method of producing a semiconductor light-emitting element, having the steps of:
 forming a GaAs layer on a semiconductor substrate,
 forming an InAs thin film layer having the plurality of InAs quantum dots on the GaAs layer,
 forming an InGaAs layer on the InAs thin film layer having the plurality of InAs quantum dots,
 forming another GaAs layer on the InGaAs layer, and repeating the steps so that a desired number of the semiconductor light-emitting elements are disposed,
 wherein As source is As$_2$.

According to the fourth aspect of the present invention, an InGaAs layer having a high In content is formed at an interface between the InAs quantum dots and the InGaAs layer, and wherein the amount of In contained in the InGaAs layer is gradually decreased in the direction away from the interface.

According to the fourth aspect of the present invention, the InAs thin film layer having the plurality of InAs quantum dots is produced at a growth temperature of not less than 540° C.

According to the fourth aspect of the present invention, the InAs thin film layer having the plurality of InAs quantum dots is produced at a growth temperature of not less than 540° C. but not more than the evaporating temperature of indium.

According to the fourth aspect of the present invention, the InAs thin film layer having the plurality of InAs quantum dots is produced at a growth speed of not less than 0.006 mL/s.

According to the fourth aspect of the present invention, the InAs thin film layer having the plurality of InAs quantum dots is produced at a growth temperature of not less than 540° C. and at a growth speed of not less than 0.006 mL/s.

According to the fourth aspect of the present invention, the semiconductor light-emitting element is a planar semiconductor light-emitting element.

BRIEF DESCRIPTION OF THE DRAWINGS

FIG. 12 is a part of spectra data shown in FIG. 11;

FIG. 14 is a part of spectra data shown in FIG. 13;

DESCRIPTION OF THE PREFERRED EMBODIMENTS

Embodiments of the present invention will be described below in detail referring to drawings.

Embodiment 1

Figure 1:
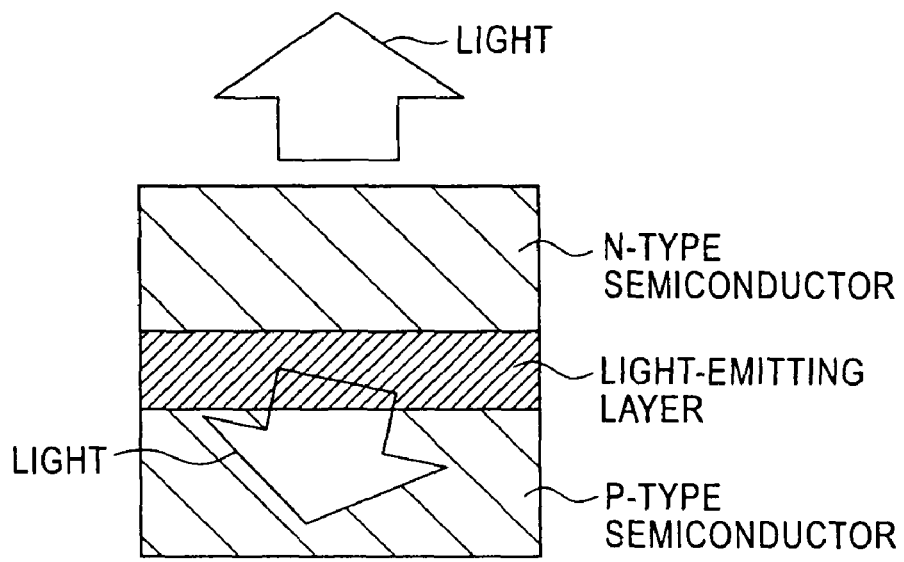
FIG. 1 is a schematic sectional view of a semiconductor light-emitting element.

FIG. 1 is a schematic sectional view of a semiconductor light-emitting element for emitting light. The semiconductor light-emitting element has an n-type semiconductor, a p-type semiconductor, and a light-emitting layer that contributes to light emission and disposed between the n-type and p-type semiconductors. When a voltage is applied to the element from above and below, positive holes flow into a light-emitting layer from the p-type semiconductor, and electrons flow into the light-emitting layer from the n-type semiconductor. The positive holes and electrons flowing into the light-emitting layer are reconnected, and light having a wavelength corresponding to materials is emitted from a side, above or below of the semiconductor light-emitting element. In particular, when a planar semiconductor light-emitting element that emits light from above and below (at a plane of different semiconductor layers) is used, areas of the positive holes and electrons that flow into the light-emitting layer are adjusted, whereby the number of the quantum dots to be provided can be adjusted. In other words, increasing the areas of the positive holes and the electrons flowed thereinto can increase the number of the quantum dots. Examples of the materials include a III-V Group compound semiconductor. The semiconductor light-emitting element comprising GaAs is used in an infrared region of 900 nm or less. On the other hand, the semiconductor light-emitting element comprising InAs quantum dots can be used in a communication wavelength region of about 1 to 1.5 μm. At present, the InAs quantum dots are mainly produced using As$_4$ source.

However, according to the present invention, As$_2$ source is used. Arsenic materials As$_4$ and As$_2$ have different diffusion lengths. Specifically, As$_2$ has longer diffusion length than As$_4$. Accordingly, InAs quantum dots using As$_2$ are larger than InAs quantum dots using As$_4$. This gives rise to the difference in light-emitting properties and density. The InAs quantum dots on GaAs comprising As$_2$ have a trade-off relationship between the high density and a long wavelength similar to the conventional quantum dots using As$_4$.

Figure 2:
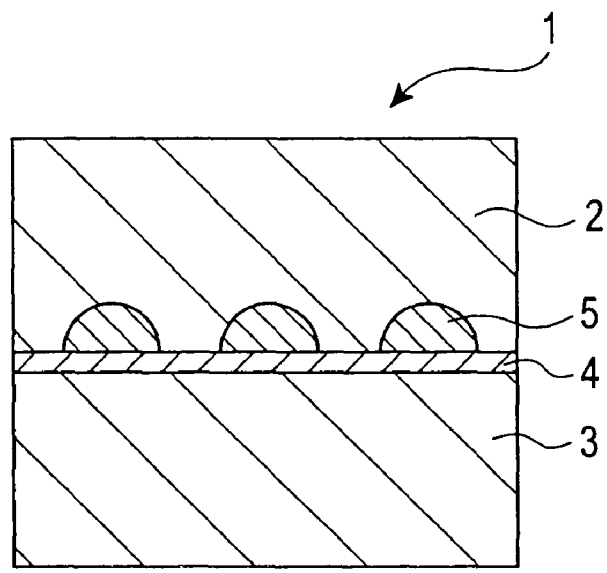
FIG. 2 is a sectional view of an InAs quantum dot structure including a GaAs layer, an InAs thin film, InAs quantum dots and another GaAs layer in that order from the bottom.
Figure 3A:
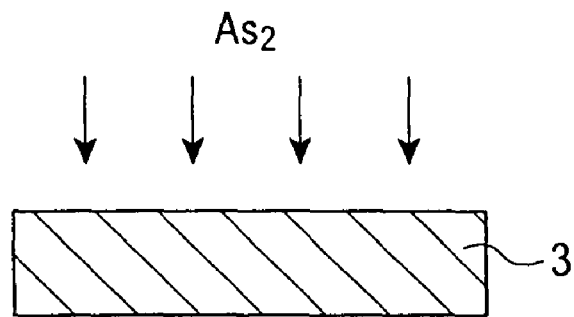
FIG. 3 shows a production process of the InAs thin film, the InAs quantum dots, and the GaAs layer on the other GaAs layer shown in FIG. 2.
Figure 3B:
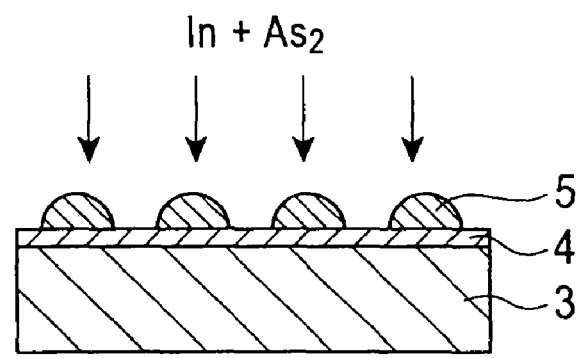
Figure 3C:
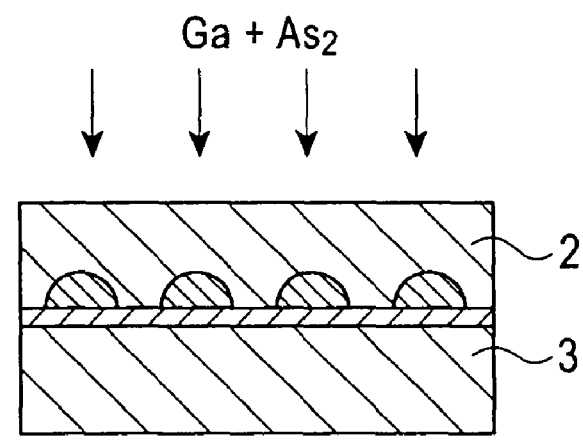

The trade-off relationship has been studied. FIG. 2 is a sectional view of an InAs quantum dot structure comprising As$_2$. FIG. 3 shows a production process thereof. As shown in FIG. 3A, As$_2$ is provided on a GaAs layer formed on a semiconductor substrate (not shown), and the growth is interrupted for 60 seconds. As shown in FIG. 3B, In and As$_2$ are provided to grow an InAs layer by 2.4 Molecular Layers (ML). As shown in FIG. 3C, a GaAs layer is grown by feeding Ga an As at the growth temperature of not more than 540° C. The feeding of As$_2$ is maintained during the interruption of the growth for 60 seconds. An InAs thin film layer that is grown at Stranski-Krastanow (S-K) mode is provided between the GaAs under layer and the InAs quantum dots. The InAs thin film layer is grown by about 1.8 mL.

Figure 4:
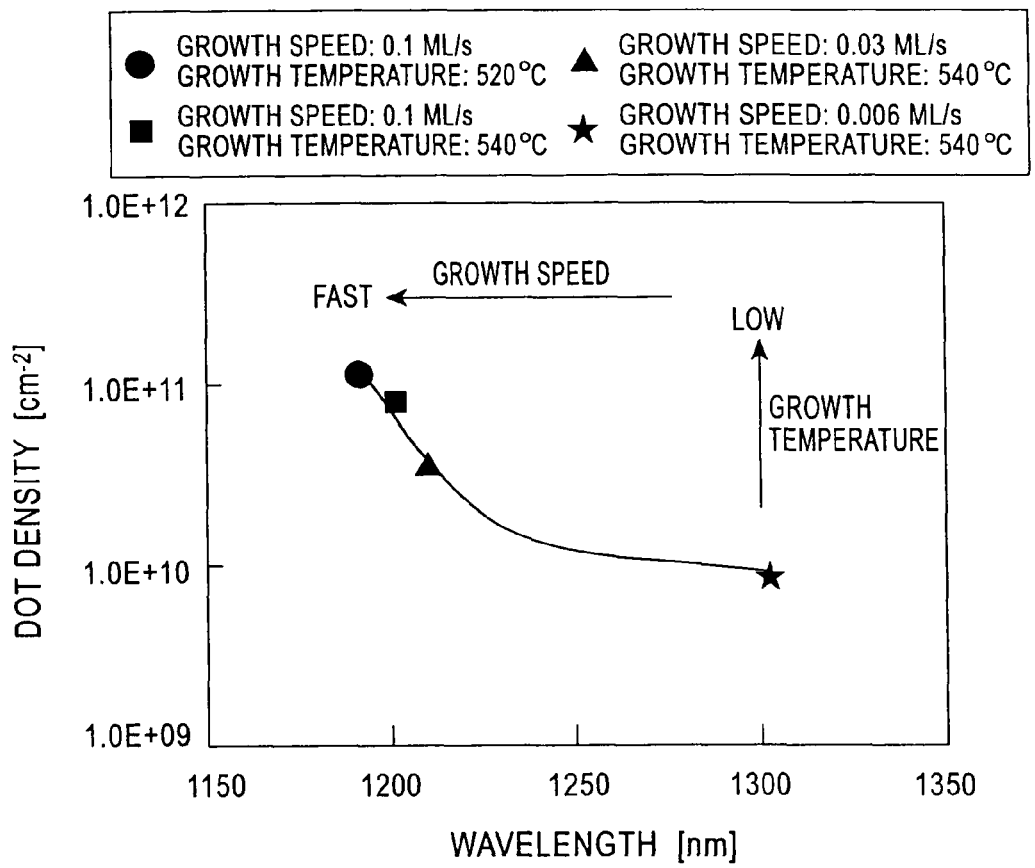
FIG. 4 is a graph showing a relationship between a light emission wavelength peak and a quantum dot surface density.

Light emission properties and a surface density of the InAs quantum dots depend on the growth temperature of the InAs layer and a feed speed of the InAs layer. FIG. 4 shows a relationship between a light emission wavelength peak and a quantum dot surface density. In FIG. 4, a wavelength is represented by nm, and a dot density is represented by dot/cm$^{-2}$.

The density of the InAs quantum dots is measured using a scanning electron microscope (SEM). Light emission wavelengths of the GaAs layer grown on the InAs quantum dots are measured using a photo luminescent (PL) method.

The light emission is 1.303 μm and a surface density of the quantum dots is $0.8 \times 10^{10}$ cm$^{-2}$ when the InAs layer is grown at the growth rate of 0.006 mL/s and at the growth temperature of 540° C. The light emission is 1.210 μm and a surface density of the quantum dots is $3.2 \times 10^{10}$ cm$^{-2}$ when the InAs layer is grown at the growth rate of 0.03 mL/s and at the growth temperature of 540° C. The light emission is 1.201 μm and a surface density of the quantum dots is $7.7 \times 10$ cm$^{-2}$ when the InAs layer is grown at the growth rate of 0.1 mL/s and at the growth temperature of 540° C. The light emission is 1.192 μm and a surface density of the quantum dots is $1.1 \times 10^{11}$ cm$^{-2}$ when the InAs layer is grown at the growth rate of 0.1 mL/s and at the growth temperature of 520° C. Thus, when the growth temperature is decreased and the growth speed is increased, the diffusion length of an atom becomes short, and thus high density can be obtained. It is therefore contemplated that higher density can be provided by feeding the material at lower temperature and at higher speed. The growth conditions are optimized to provide high density exceeding $1.1 \times 10^{11}$ cm$^{-2}$, which is better than the conventional one (see Japanese Unexamined Patent Application Publication No. 2001-24284).

Embodiment 2

Figure 5:
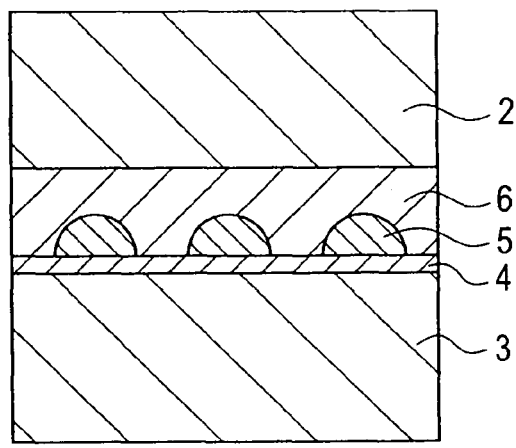
FIG. 5 is a sectional view of a semiconductor light-emitting element according to the present invention having a GaAs layer, an InAs thin film, InAs quantum dots, an InGaAs layer and another GaAs layer.

FIG. 5 is a sectional view of a structure according to the present invention. FIG. 6 shows a production process thereof. As shown in FIG. 5, a GaAs layer 3 is grown on a semiconductor substrate (not shown), and an InAs thin film layer 4, InAs quantum dots 5 and an InGaAs layer 6 are formed thereon and planarized. Finally, another GaAs layer 2 is formed on top to provide a semiconductor light-emitting element 1.

Figure 6A:
FIG. 6 shows a production process of the InAs thin film, the InAs quantum dots, the InGaAs layer and the GaAs layer on the another GaAs layer shown in FIG. 5.
Figure 6B:
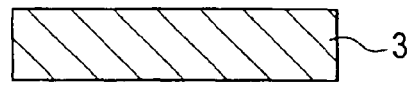
Figure 6C:
Figure 6D:
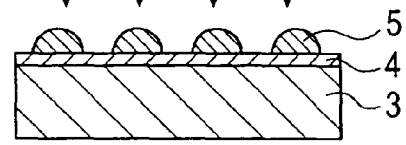
Figure 6E:

As shown in FIG. 6A, As$_2$ is provided on a GaAs layer, and the growth is interrupted for 60 seconds. As shown in FIG. 6B, In and As$_2$ are provided to produce InAs quantum dots 5. As shown in FIG. 6C, the growth temperature is decreased by 50° C. during the interruption of the growth for 30 seconds while feeding As$_2$. As shown in FIG. 6D, In, Ga and As$_2$ are fed to grow an InGaAs layer 6. As shown in FIG. 6E, Ga and As$_2$ are fed to grow a GaAs layer 2. The higher the In content of the InGaAs layer 6 is, the more the strain between the InAs quantum dots 5 and the GaAs layer can be reduced, thereby improving the properties of the quantum dots. The best composition of the InGaAs layer 6 is In$_{0.5}$Ga$_{0.5}$As having a moderate strain between the InAs quantum dots and the InGaAs layer. The InGaAs layer 6 typically has an In content of 20% or less. If the In content is high, a film thickness exceeds a critical value and a misfit transfer occurs. A half width of the light emission becomes wide causing degradation of the light emission properties. According to the present invention, the thickness of the InGaAs layer is decreased to avoid the misfit transfer due to the critical thickness.

Thickness and Composition of InGaAs Layer

Figure 7:
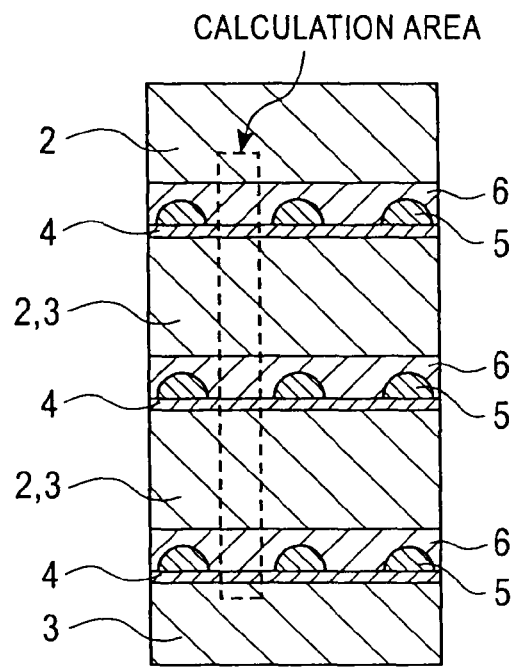
FIG. 7 is a sectional view of a semiconductor light-emitting element according to the present invention having three-layered InAs quantum dots.
Figure 8:
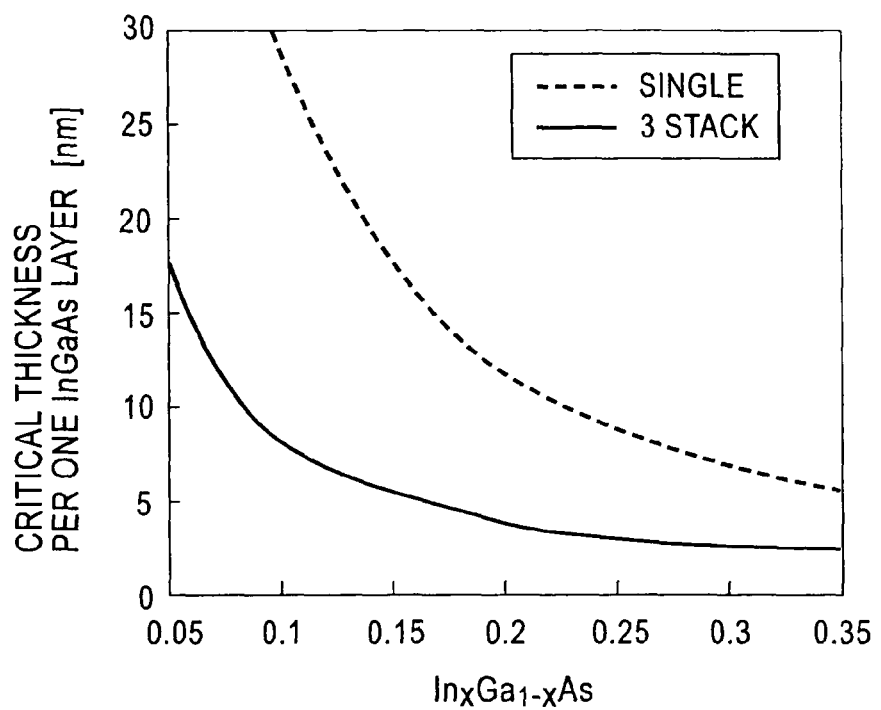
FIG. 8 is a graph showing a relationship between a composition of an InGaAs layer and a critical thickness.

The critical thickness and the composition of the InGaAs layer are determined. The InGaAs layer having the high In content on the InAs quantum dots can effectively lengthen the wavelength. However, an area having no quantum dots (i.e., calculation area) produces a strain, which adversely affects the light-emitting properties. Next, the critical thicknesses of the InAs thin film layer having no quantum dots and the InGaAs layer (see FIG. 5) are calculated. FIG. 8 shows the results. In FIG. 8, the ordinate represents a critical thickness per InGaAs layer in nm, and the abscissa represents a suffix "x" in the In$_x$Ga$_{1-x}$As layer. The Matthews method is used for calculation. FIG. 7 shows the three-layered InAs quantum dots structure suitable for providing the high density in this case.

The layered structure is in the following order from the bottom:
the GaAs layer 3,
the InAs thin film layer 4,
2.4 mL of the InAs quantum dots 5,
the InGaAs layer 6 for burying the InAs quantum dots 5 and planarizing,
26 nm of the GaAs layer 2(3),
the InAs thin film layer 4,
2.4 mL of the InAs quantum dots 5,
the InGaAs layer 6 for burying the InAs quantum dots 5 and planarizing,
26 nm of the GaAs layer 2(3),
the InAs thin film layer 4,
2.4 mL of the InAs quantum dots 5,
the InGaAs layer 6 for burying the InAs quantum dots 5 and planarizing, and
26 nm of the GaAs layer 2.

As the InGaAs layer has the high In content, the critical thickness thereof becomes thin. For example, when In$_{0.25}$Ga$_{0.75}$As is used for the one-layer structure shown in FIG. 5, the critical thickness is 9 nm. In contrast, the same is used for the three-layered structure shown in FIG. 7, whereby the critical thickness is as thin as 2.9 nm. In other words, the three layers shown in FIG. 7 correspond to the one layer shown in FIG. 5, i.e., one of the three layers shown in FIG. 7 has about one-third of the thickness or less of the one layer shown in FIG. 5, such that the three layers should be thin for lamination. In such a structure, when the InGaAs layer has a high In content, the critical thickness does not degrade the light emission properties.

Composition Gradient

Figure 9A:
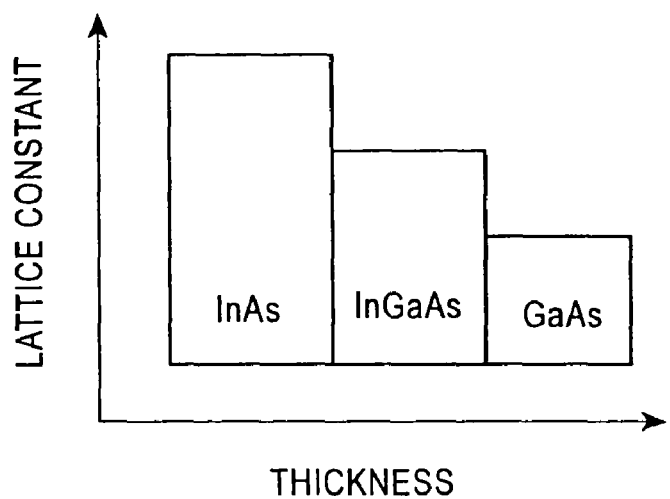
FIG. 9 shows a relationship between lattice constants of our proposed gradient composition InGaAs layer and conventional InGaAs layer.
Figure 9B:
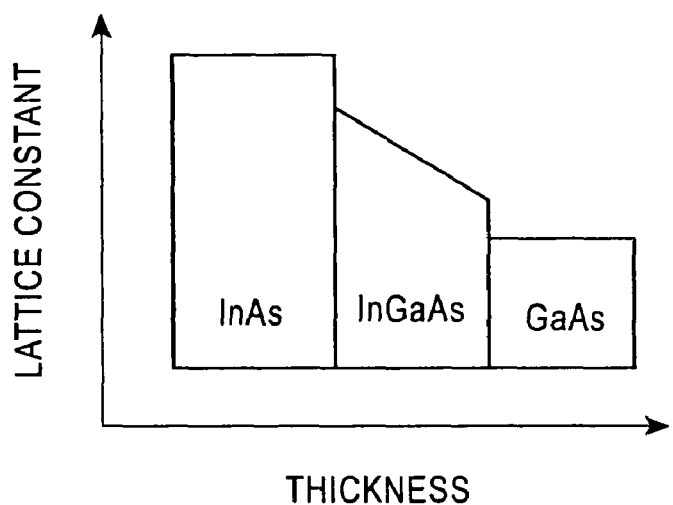

In the present invention, a composition gradient is applied. The InGaAs layer having the high In content is grown only at the interface between the InAs quantum dots and the InGaAs layer to lengthen the wavelength, and the In content is decreased in the InGaAs layer in the direction away from the interface. Thus, the strain at the interface between the InAs quantum dots and the InGaAs layer is significantly reduced, the total In content is decreased, and the wavelength can be lengthened without the misfit transfer. As shown FIG. 9A, in the conventional semiconductor light-emitting element with InGaAs layer, the strain is applied at the interface between InAs and InGaAs and at the interface between InGaAs and GaAs. However, as shown in FIG. 9B, when the composition gradient InGaAs is used, the strain at the interface between InAs and InGaAs and at the interface between InGaAs and GaAs can be reduced.

Figure 10:
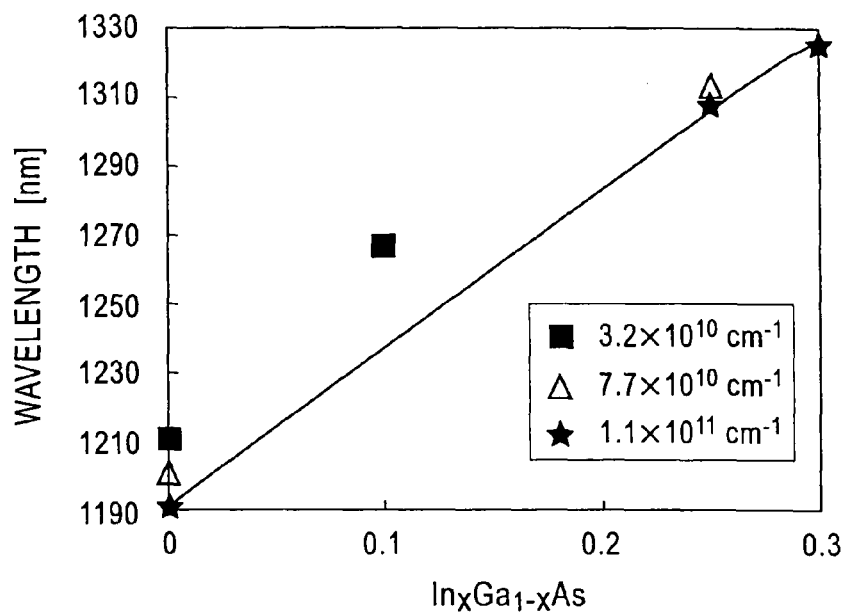
FIG. 10 is a graph showing a relationship between a composition of an InGaAs layer and a light emission wavelength peak.

Using As$_2$ described above, InAs quantum dots having a light emission wavelength peak of 1.192 μm and a surface density of $1.1 \times 10^{11}$ cm$^{-2}$, and InAs quantum dots having a light emission wavelength peak of 1.201 μm and a surface density of $7.7 \times 10^{11}$ cm$^{-2}$, InAs quantum dots having a light emission wavelength peak of 1.210 μm and a surface density of $3.2 \times 10^{11}$ cm$^{-2}$ are produced. The InGaAs layer had a thickness of 3.0 nm. The InGaAs layer at the interface of InAs quantum dots had the composition of In$_{0.1}$Ga$_{0.9}$As, In$_{0.25}$Ga$_{0.75}$As and In$_{0.3}$Ga$_{0.7}$As, respectively. The InGaAs layer at the GaAs interface had the composition of In$_{0.07}$Ga$_{0.93}$As, In$_{0.12}$Ga$_{0.88}$As and In$_{0.13}$Ga$_{0.87}$As, respectively. FIG. 10 shows a relationship between a composition of an InGaAs layer and a light emission wavelength peak. The light emission wavelength peaks shift to the longer wavelength. In the case of In$_{0.1}$Ga$_{0.9}$As, the wavelength is lengthened 56 nm. In the case of In$_{0.25}$Ga$_{0.75}$As, the wavelength is lengthened 112 nm. In the case of In$_{0.3}$Ga$_{0.7}$As, the wavelength is lengthened 133 nm.

Figure 11:
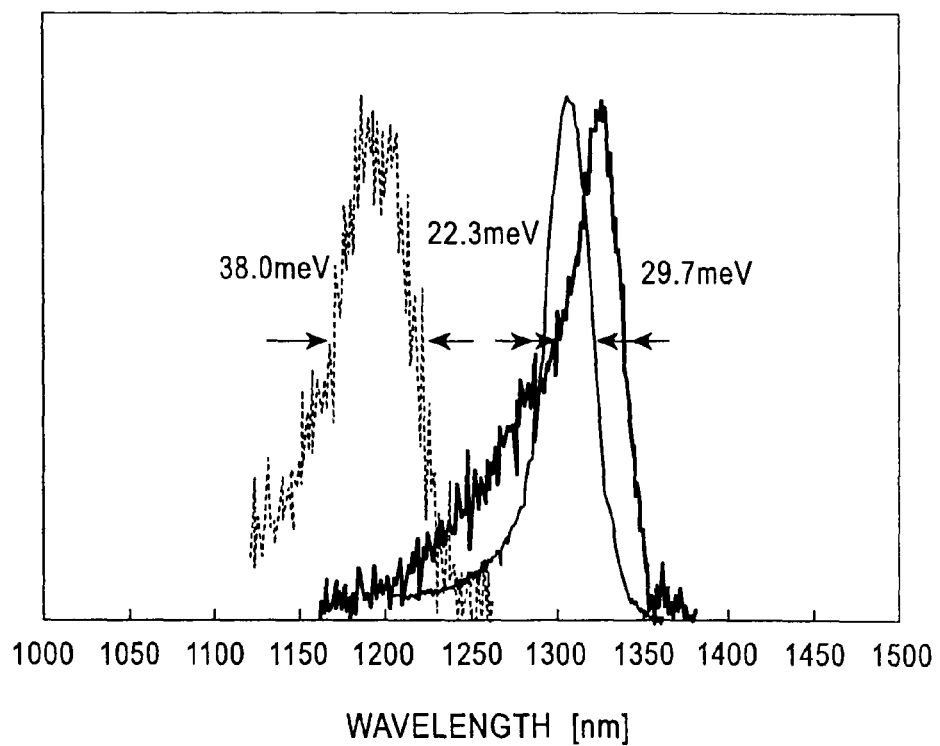
FIG. 11 is a graph showing an emission spectra of quantum dots of InGaAs layers having different In contents with a surface density of $1.1 \times 10^{11}$ cm$^{-2}$.

As shown in FIGS. 11 and 12, the InAs quantum dots having a surface density of $1.1 \times 10^{11}$ cm$^{-2}$ lengthen the wavelength to 1.308 μm and 1.325 μm. The half widths are also improved from 38.0 mV to 22.3 meV and 29.7 meV. The significant decrease in the half widths can be achieved by decreasing the level of the dots caused by the large strain between the InAs quantum dots and the InGaAs layer, and promoting the light emission of the original quantum dots.

There is provided the same advantage even if the composition gradient is a step-like gradient or a gradual gradient. When the composition gradient is increased, the In content of the InGaAs layer at the interface of InAs can be increased, thereby producing good quality crystal. Ultimately, $In_{0.5}Ga_{0.5}As$ can be provided. In this case, the InAs quantum dots have a density of as high as $1.1\times10^{11}$ cm$^{-2}$, and can emit light at a wavelength of 1.3 μm.

The concept of the composition gradient can be applied to all typical semiconductors having high strain. When certain crystal having a certain lattice constant is used to produce different crystal having a different lattice constant, the composition gradient is used, whereby an element having good crystal can be produced. Examples of a combination of materials include Si and SiGe, GaN and AlInN, InN and GaAlN, InAs and InGaAsP, and InAs and AlInAsP. As a matter of course, the same can be applied to III-V Group compound semiconductors and II-VI Group compound semiconductors where crystal can be grown.

Figure 13:
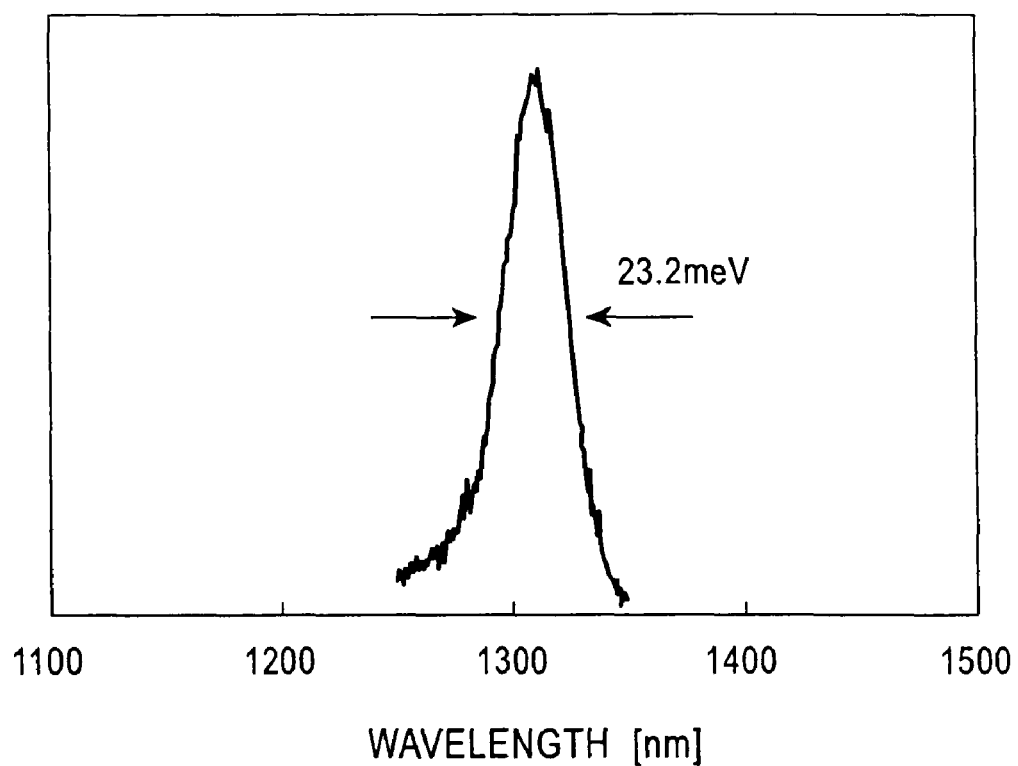
FIG. 13 is a graph showing an emission spectra of three-layered InAs quantum dots with a surface density of $1.1 \times 10^{11}$ cm$^{-2}$.

The three-layered structure is produced using InAs quantum dots having a surface density of $1.1\times10^{11}$ cm$^{-2}$ to determine the light emission properties by repeating the production process shown in FIG. 6 three times. Since $As_2$ having long diffusion length is used, the GaAs layer on the InGaAs layer is not easily planarized. Accordingly, the growth speed of GaAs should be as low as 1.0 μm/hour or less. The growth temperature of the upper (second and third) layers is preferably the same or 5° C. higher as/than that of the lower (first and fourth) layers. FIGS. 13 and 14 shows the light emission properties. The light emission wavelength peak is 1.309 μm and the half width is 23.2 meV. The narrow half width can be obtained by providing good quality crystal and producing almost similar InAs quantum dots in the first, second and third layers. The results also reveal that the crystal can be produced without the misfit transfer even if the InGaAs layer having the thickness exceeding the critical thickness calculated as shown in FIG. 8 is used, since the composition gradient is used. The surface density is $3.3\times10^{11}$ cm$^{-2}$ of the quantum dots, thereby achieving a high density level that is conventionally never provided. By increasing the composition gradient and optimizing the layered structure, a multi-layered structure having four or more layers can be provided.

When the $Ga_{0.75}In_{0.25}As$ or $Ga_{0.7}In_{0.3}As$ having the high In content is used on the InAs quantum dots, the quantum dots that emit light at a wavelength of 1.3 μm or more, i.e., 1.308 μm or 1.325 μm can be produced at a density of as high as $1.1\times10^{11}$ cm$^{-2}$. The half widths can also be improved from 38.0 mV to 22.3 meV and 29.7 meV.

Production of High Density Quantum Dots

The density of the quantum dots are determined by the conditions upon growth including the temperature, the speed and the pressure, which will be described below.

Temperature Dependency

In Embodiment 1, when the growth temperature of the InAs layer is decreased and the growth speed is increased, the diffusion length of an atom became short and the quantum dots having the high density could be obtained. The conditions are only for achieving the high density. If the growth temperature is increased, crystallinity becomes poor, and the current applied does not contribute to the light emission and tends escape as heat.

Next, the growth speed is fixed and the growth temperature is changed to determine the light emission intensity properties.

Figure 15:
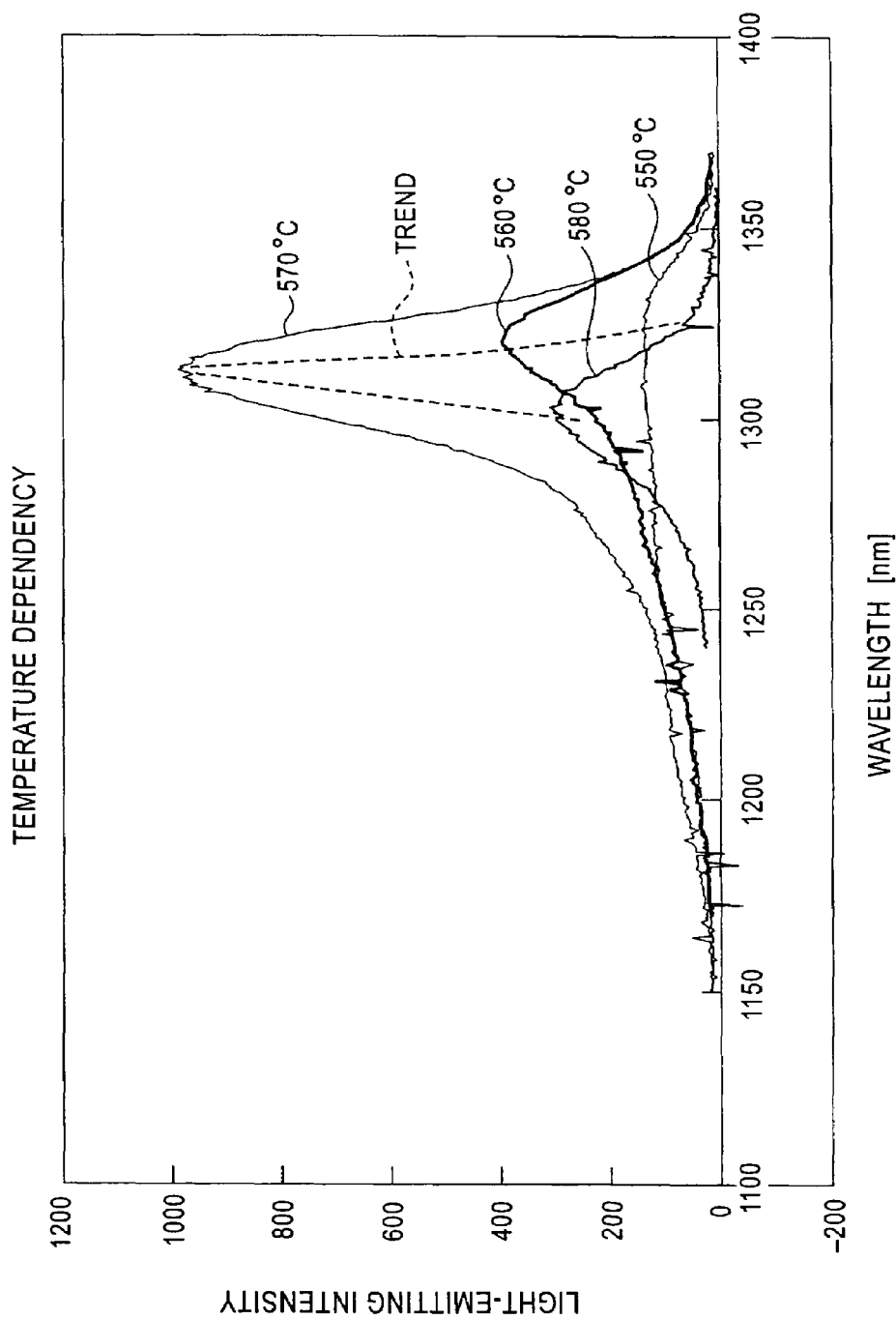
FIG. 15 is a graph showing temperature dependency of light-emitting intensity of the semiconductor light-emitting element according to the present invention.

FIG. 15 is a graph showing temperature dependency of light-emitting intensity of the semiconductor light-emitting element according to the present invention.

It shows the temperature dependency when the InAs quantum dots 5 of the semiconductor light-emitting element and the InGaAs layer 6 are grown at the growth speed of 0.1 mL/s.

It shows a relationship between the wavelength (abscissa: am) when the growth temperature of the quantum dots is 550° C., 560° C., 570° C. or 580° C. and the light-emitting intensity (ordinate: photons per unit hour). Table 1 shows a sampling data of the temperature dependency. In the case of the growth temperature is 540° C., the result is already shown and the data, therefore, is omitted.

The peak of the quantum dots grown at 550° C. is 143.5 at a frequency of 1309 nm. The peak of the quantum dots grown at 560° C. is 400.2 at a frequency of 1321 nm. The peak of the quantum dots grown at 570° C. is 980.6 at a frequency of 1311 nm. The peak of the quantum dots grown at 580° C. is 302.0 at a frequency of 1303 nm.

The temperature dependency curve of the quantum dots grown at 550° C. is almost not changed. The quantum dots grown at 570° C. had a steep peak in the temperature dependency curve. The temperature dependency curve of the quantum dots grown at 580° C. is again returned to the less changing state. The peak of the temperature dependency curve has a trend to be changed steeply shown in a doted line when the temperature is changed. The temperature dependency curve of the quantum dots grown at 570° C. is preferable.

The quantum dots grown at 550° C. to 570° C. have steeply almost identical size and the light emission intensity is increased. On the other hand, the quantum dots grown at 570° C. to 580° C. lost their materials, especially indium by evaporation, and the numbers of the quantum dots are steeply decreased. Therefore, the light emission intensity is steeply decreased. Even with the quantum dots grown at 580° C., the light emission intensity is in a usable frequency area.

As described above, the growth temperature of not less than 540° C. can be applied.

Within the growth temperature of 540° C. to the evaporating temperature of Indium, the light-emitting intensity can be increased. The growth temperature is preferably 570° C.±10° C., and more preferably 570° C.

TABLE 1

| Wavelength (nm) | Temperature | | | |
|---|---|---|---|---|
| | 550° C. | 560° C. | 570° C. | 580° C. |
| 1150 | 12.0 | 14.4 | 15.2 | |
| 1160 | 14.6 | 16.2 | 18.0 | |
| 1170 | 17.2 | 22.2 | 25.4 | |
| 1180 | 20.4 | 24.8 | 33.6 | |
| 1190 | 25.8 | 26.4 | 66.2 | |
| 1200 | 39.8 | 42.4 | 66.2 | |
| 1210 | 45.6 | 51.2 | 81.6 | |
| 1220 | 55.2 | 58.6 | 89.2 | |
| 1230 | 68.6 | 73.0 | 99.2 | |
| 1240 | 84.6 | 83.6 | 113.6 | 24.0 |
| 1250 | 97.0 | 99.8 | 131.0 | 34.0 |
| 1260 | 111.4 | 116.4 | 178.4 | 50.0 |
| 1270 | 122.0 | 137.2 | 228.0 | 76.0 |
| 1280 | 119.0 | 154.6 | 288.0 | 122.0 |
| 1290 | 125.4 | 180.6 | 435.4 | 208.0 |
| 1300 | 132.2 | 225.0 | 723.8 | 298.0 |
| 1310 | 137.0 | 309.2 | 965.6 | 256.0 |
| 1320 | 137.8 | 397.6 | 850.2 | 120.0 |
| 1330 | 132.2 | 319.4 | 430.6 | 36.0 |
| 1340 | 93.6 | 159.0 | 162.6 | 20.0 |
| 1350 | 43.2 | 59.8 | 63.2 | 10.0 |
| 1360 | 15.6 | 23.6 | 21.0 | 6.0 |
| 1370 | 9.8 | 14.2 | 14.6 | |

Increase in Light-Emitting Intensity by Providing High Density

Figure 16:
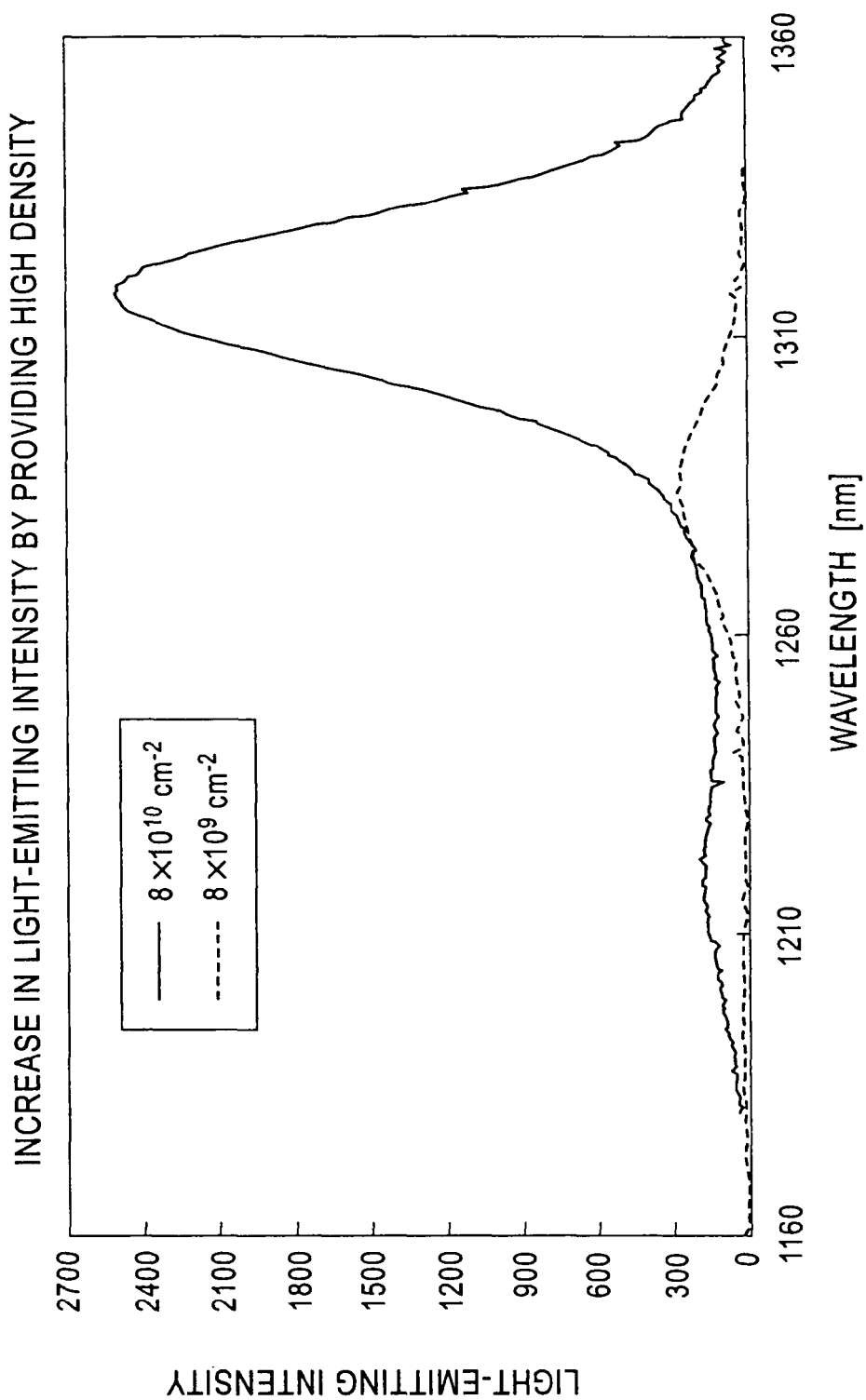
FIG. 16 is a graph showing an increase in light-emitting intensity by providing high density of the sole semiconductor light-emitting element according to the present invention.

FIG. 16 is a graph showing an increase in light-emitting intensity by providing the high density of the sole semiconductor light-emitting element according to the present invention. It shows a relationship between the wavelength (abscissa: nm) when the growth temperature of the quantum dots is changed, and the light-emitting intensity (ordinate: photons per unit hour). Using the semiconductor light-emitting element shown in FIG. 5, the measurement is made under the conditions that the growth temperature is 570° C. and the growth speed is 0.1 mL/s where ML/s represents Mono Layer/sec.

Table 2 shows a sampling data of the light-emitting intensity of the sole element.

When the surface density of the quantum dots is increased from $8 \times 10^9$ cm$^{-2}$ to $8 \times 10^{10}$ cm$^{-2}$ to point up the one place with a decimal, the peak of the curve at a wavelength of 1288 µm and a light-emitting intensity of 250 obtained at the surface density of $8 \times 10^9$ cm$^{-2}$ is changed to the peak of the curve at a wavelength of 1319 µm and a light-emitting intensity of 2500 obtained at the surface density of $8 \times 10^{10}$ cm$^{-2}$. In other words, when the surface density is increased by 10 times, the light-emitting intensity is also increased by 10 times. Consequently, the semiconductor light-emitting element according to the present invention has a tendency to increase the light-emitting intensity depending on the high density of the quantum dots.

TABLE 2

| Wavelength (nm) | Quantum dot density | |
|---|---|---|
| | $8 \times 10^9$ cm$^{-2}$ | $8 \times 10^{10}$ cm$^{-2}$ |
| 1160 | 6 | |
| 1180 | 20 | 40 |
| 1200 | 30 | 114 |
| 1220 | 10 | 172 |
| 1240 | 14 | 134 |
| 1260 | 76 | 136 |
| 1280 | 242 | 272 |
| 1300 | 154 | 1154 |
| 1320 | 50 | 2432 |
| 1340 | 2 | 618 |
| 1360 | | 76 |

Relationship Between a Growth Rate and a Surface Density

Figure 17:
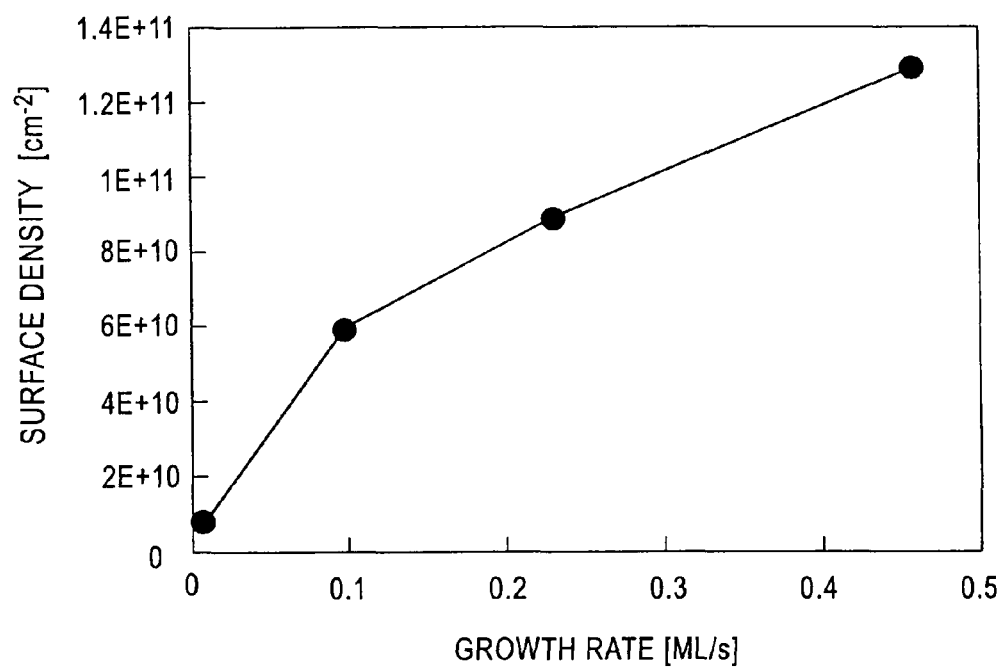
FIG. 17 is a graph showing a relationship between a growth rate and a surface density of the quantum dots according to the present invention.

FIG. 17 is a graph showing a relationship between a growth rate and a surface density of the quantum dots according to the present invention.

The measurement is made under the conditions that the growth temperature is fixed to 570° C. and the growth speed is changed using the quantum dots having the structure shown in FIG. 5. Table 3 shows a sample data of the relationship between the growth rate and the density.

It is the first time to produce the quantum dots using at the growth rate of not less than 0.006 mL/s according to the present invention.

The high density can be obtained by increasing the growth rate, i.e., 0.006 mL/s, 0.1 mL/s, 0.23 mL/s and 0.46 mL/s. According to the data, it can be concluded that the surface density is proportion to the growth rate. It is preferable that the growth speed or the growth rate of the quantum dots be high.

TABLE 3

| Growth rate (ML/s) | Surface density (cm$^{-2}$) |
|---|---|
| 0.006 | 8.00E+09 |
| 0.100 | 6.00E+10 |
| 0.230 | 9.00E+10 |
| 0.460 | 1.30E+11 |

Production of Strain Reducing Layer with Composition Gradient

In view of the above, in order to improve the strain reducing layer with the composition gradient, the growth speed and the growth temperature are preferably increased. In order to increase the growth speed, the use of the plurality of material feeding lines are effective. When the speed is further increased, the strain reducing layer with high quality can be produced without the composition gradient.

InAs Quantum Dot Laser

The InAs quantum dot laser according to the present invention comprises the laser element having one layer of quantum dots as described above as a basic component. The plurality of the laser elements are layered to provide the desired properties. The three-layered quantum dot laser elements will be described below.

Figure 18:
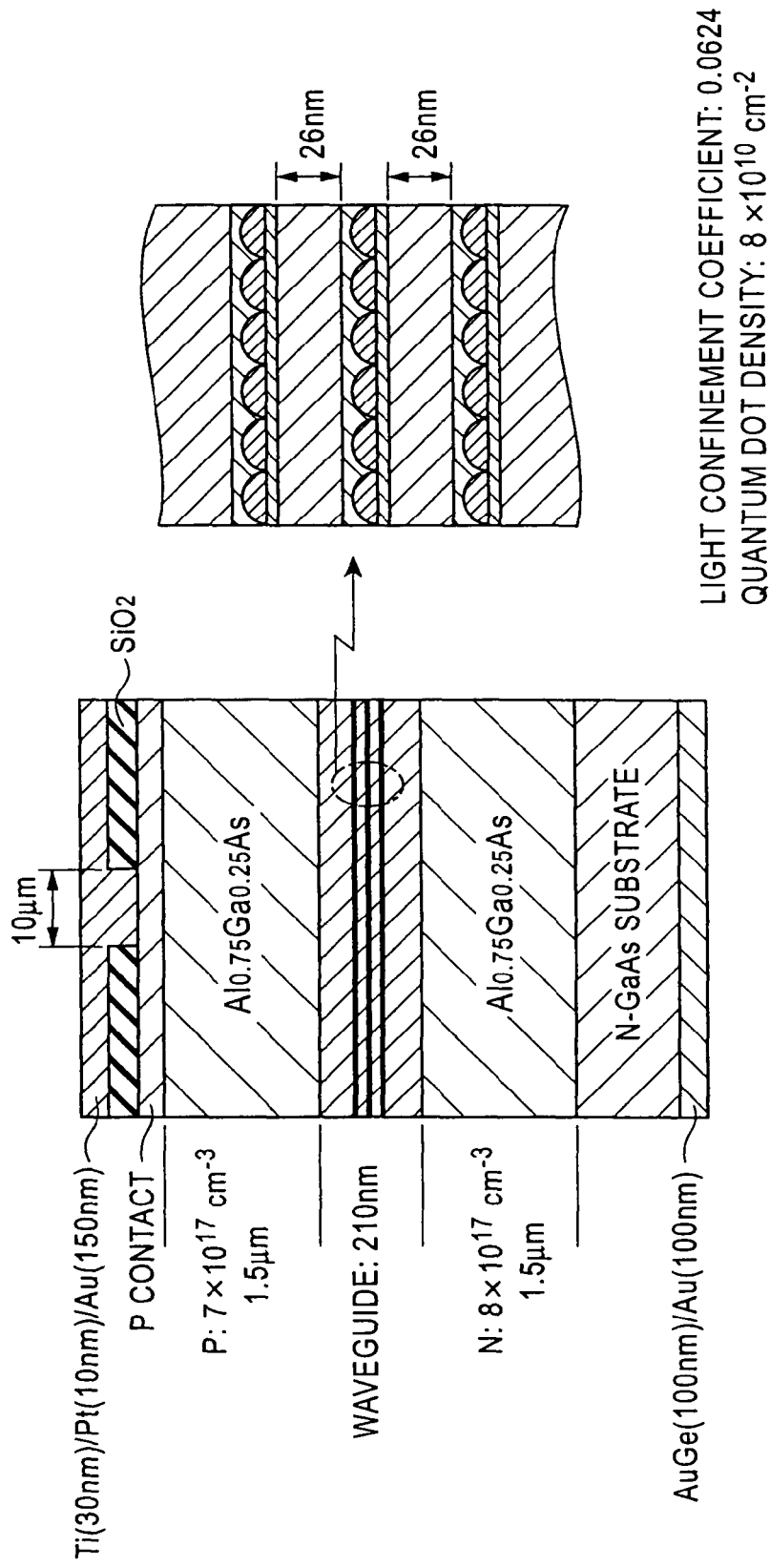
FIG. 18 is a sectional view of an InAs quantum dot laser having three-layered quantum dot laser elements according to the present invention.

FIG. 18 is a sectional view of an InAs quantum dot laser comprising three-layered quantum dot laser elements according to the present invention.

1.5 µm of an Al$_{0.75}$Ga$_{0.25}$As layer having an n-type impurity density of $8 \times 10^{17}$ cm$^{-3}$ is laminated on an n-type GaAs substrate, and 210 nm of the three-layered quantum dot laser element that became a waveguide are laminated thereon (see FIG. 7).

1.5 µm of an Al$_{0.75}$Ga$_{0.25}$As layer having a p-type impurity density of $7 \times 10^{17}$ cm$^{-3}$ is laminated on the three-layered quantum dot laser element. On the p-type layer, a p-type contact is formed. An electrode of AuGe(100 nm)/Au(100 nm) is disposed on the n-GaAs substrate. An electrode of Ti(30 nm)/Pt(10 nm)/Au(150 nm) is disposed on the p-contact. The GaAs layer 2(3) between the InAs thin film layer 4 and the InGaAs layer 6 had a thickness of 26 nm. In this case, a light confinement coefficient is 0.0624, and the quantum dot density is $8 \times 10^{10}$ cm$^{-2}$.

Laser Characteristics 1

Figure 19:
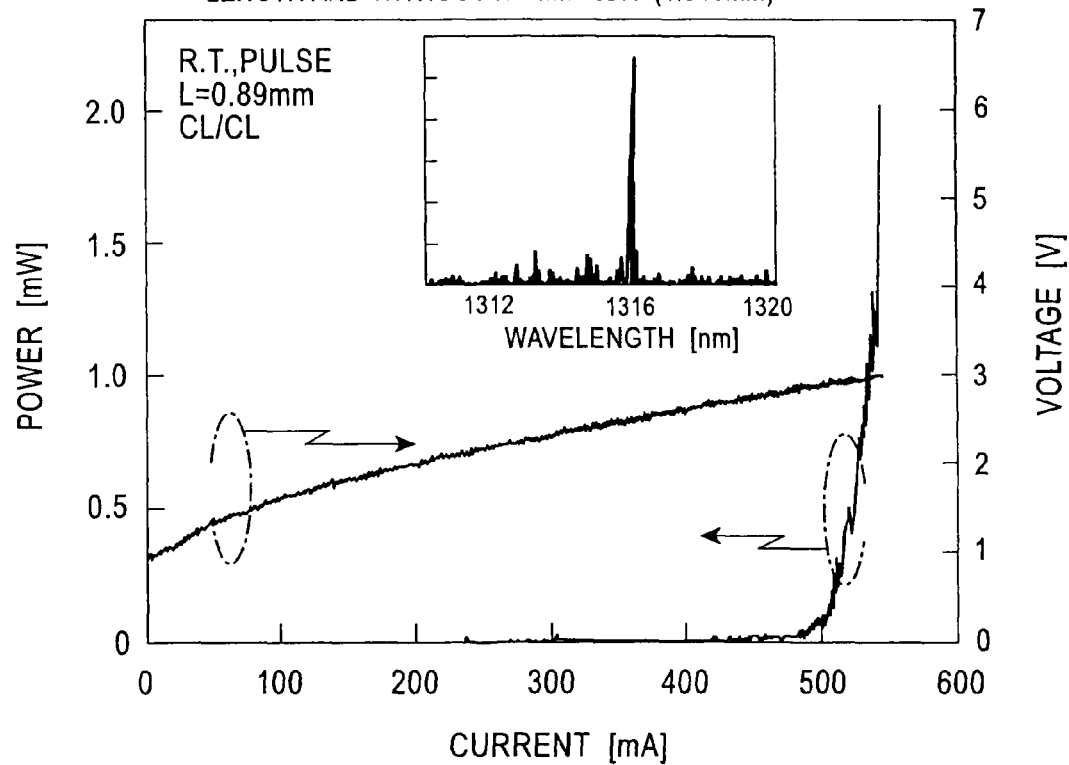
FIG. 19 shows properties of a semiconductor laser element having five-layered high density quantum dots.

FIG. 19 shows characteristics of the semiconductor laser element obtained by the following conditions. Table 4 shows a sampling data.

Conditions
  Using five layered high density quantum dots
  Base level oscillation with short resonator length and without HR mirror (1.316 µm)
  R.T., Pulse, room temperature (high frequency pulse)
  Resonator length L=0.89 mm
  CL/CL (only cleavage plane, no HR coat)
  Laser is oscillated at 500 mA or more. The laser can oscillate with a structure having only cleavage plane and with a laser oscillation length of 0.89 mm. This is because the number of the quantum dots is great, whereby many carriers are treated.

TABLE 4

| Current(mA) | Power[mW] | Voltage[V] |
|---|---|---|
| 0 | 0 | 0.000000 |
| 50 | 0 | 1.323703 |
| 100 | 0 | 1.616985 |
| 150 | 2.57E-03 | 1.835083 |

TABLE 4-continued

| Current(mA) | Power[mW] | Voltage[V] |
|---|---|---|
| 200 | 4.68E−04 | 1.985856 |
| 250 | 4.79E−03 | 2.176944 |
| 300 | 6.66E−03 | 2.316026 |
| 350 | 6.78E−03 | 2.449666 |
| 400 | 1.23E−02 | 2.606084 |
| 450 | 1.52E−02 | 2.748996 |
| 500 | 9.36E−02 | 2.854820 |
| 540 | 1.61E+00 | 2.974149 |

Laser Properties 2

Figure 20:
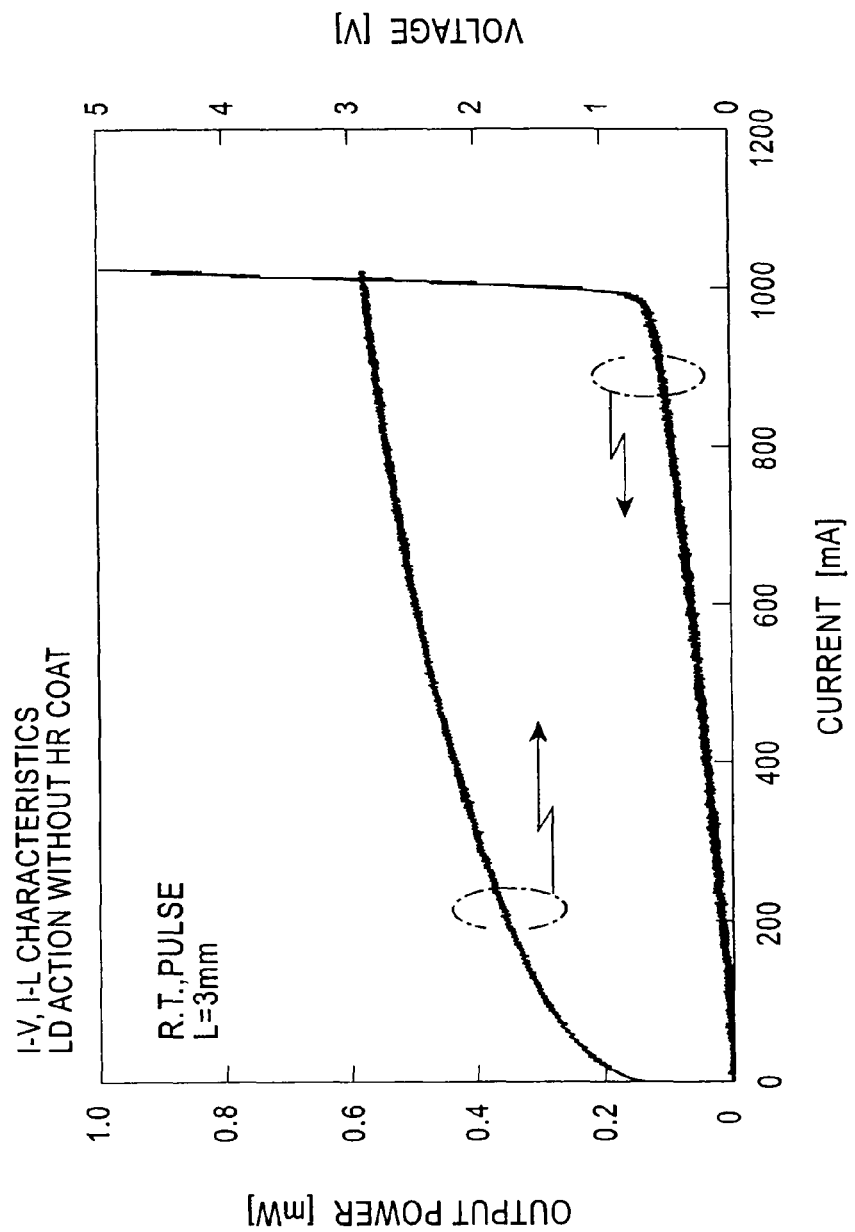
FIG. 20 shows properties of the semiconductor laser element having three-layered quantum dots according to the present invention.

FIG. 20 shows I-V (current-voltage) characteristics and I-L (current-light quantity) characteristics of the semiconductor laser element obtained by the following conditions. Table 5 shows a sampling data.

Conditions

Using the three layered structure

LD action without HR coat (high reflectance mirror

R.T., Pulse, room temperature (high frequency pulse)

Resonator length L=3 mm

CL/CL (only cleavage plane, no HR coat)

Laser is oscillated at 1000 mA or more. The laser can oscillate with a structure having only cleavage plane and with a laser oscillation length of 3 mm. This is because the number of the quantum dots is great, whereby many carriers are treated.

TABLE 5

| Current[mA] | Output Power[mW] | Voltage[V] |
|---|---|---|
| 0 | 0 | 0 |
| 100 | 5.13E−03 | 1.452304 |
| 200 | 1.34E−02 | 1.756471 |
| 300 | 2.93E−02 | 1.997144 |
| 400 | 3.94E−02 | 2.183394 |
| 500 | 4.80E−02 | 2.352510 |
| 600 | 5.90E−02 | 2.484336 |
| 700 | 7.87E−02 | 2.632086 |
| 800 | 8.93E−02 | 2.725211 |
| 900 | 1.06E−01 | 2.793543 |
| 1000 | 1.63E−01 | 2.889087 |
| 1025 | 9.73E−01 | 2.914887 |

Various modification and alternations of the structure of the element and the method of producing the same that do not depart from the scope and intent of the present invention will become apparent to those skilled in the art.

According to the present invention, the following advantages can be provided.

(1) The arsenic material is changed from $As_4$ to $As_2$, whereby the production method that cannot be used for $As_4$ can be used.

(2) The growth temperature and the growth speed can be optimized. In particular, the second InAs thin film layer having the plurality of InAs quantum dots is produced at the growth temperature of not less than 540° C. and at the growth speed of not less than 0.006 mL/s, whereby the quantum dot density can be improved and the light-emitting intensity can be increased.

(3) InGaAs having the high In content is used, whereby the lattice constants can be matched.

(4) The InGaAs layer with a modified composition or composition gradient is used to increase the density and quality of the quantum dots that emit light at a wavelength of 1.3 μm.

(5) The planar semiconductor light-emitting element is used to adjust the area for handling light, and to increase the number of quantum dots.

What is claimed is:

1. A method of producing a semiconductor light-emitting element, comprising:

forming a first layer of GaAs layer on a semiconductor substrate having Ga by providing $As_2$;

forming a second layer of InAs thin film layer having a plurality of InAs quantum dots on the first layer of GaAs layer by providing In and $As_2$ at a growth temperature from 540° C. to 580° C.;

forming a third layer of InGaAs layer on the second layer of InAs thin film layer having the plurality of InAs quantum dots by providing In, Ga and $As_2$; and forming a fourth layer of GaAs layer on the third layer of InGaAs layer by providing Ga and $As_2$, wherein, an InGaAs layer having a high In content is formed at an interface between the InAs quantum dots and the third layer of InGaAs layer, and the amount of In contained in the InGaAs layer is gradually decreased in a direction away from the interface.

2. The method of producing a semiconductor light-emitting element according to claim 1, wherein the second layer of InAs thin film layer having the plurality of InAs quantum dots is produced at a growth speed of not less than 0.006 mL/s.

3. The method of producing a semiconductor light-emitting element according to claim 1, further comprising:

forming an InAs thin film layer having a plurality of InAs quantum dots on the fourth layer of GaAs layer by providing In and $As_2$.

* * * * *